(12) United States Patent
Bae et al.

(10) Patent No.: US 11,380,625 B2
(45) Date of Patent: Jul. 5, 2022

(54) SHIELDING STRUCTURE, SEMICONDUCTOR PACKAGE STRUCTURE WITH SHIELDING STRUCTURE

(71) Applicant: Advanced Semiconductor Engineering Korea, Inc., Gyeonggi-Do (KR)

(72) Inventors: Soonheung Bae, Gyeonggi-Do (KR); Jyhwan Lee, Gyeonggi-Do (KR); Jaeshin Cho, Gyeonggi-Do (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 0 days.

(21) Appl. No.: 17/009,601

(22) Filed: Sep. 1, 2020

(65) Prior Publication Data

US 2022/0068831 A1 Mar. 3, 2022

(51) Int. Cl.
*H01L 21/268* (2006.01)
*H01L 23/552* (2006.01)
*H01L 25/065* (2006.01)

(52) U.S. Cl.
CPC ........ *H01L 23/552* (2013.01); *H01L 25/0655* (2013.01)

(58) Field of Classification Search
None
See application file for complete search history.

(56) References Cited

U.S. PATENT DOCUMENTS

| 10,530,050 | B2* | 1/2020 | Nguyen | H01Q 1/38 |
| 2014/0239465 | A1* | 8/2014 | Yen | H01L 23/552 |
| | | | | 257/659 |
| 2019/0198990 | A1* | 6/2019 | Nguyen | H01Q 1/526 |
| 2020/0251422 | A1* | 8/2020 | Lee | H01L 23/552 |

OTHER PUBLICATIONS

Armstrong, Keith, "Design Techniques for EMC—Part 4 Shielding", Cherry Clough Consultants, Aug. 23, 2013, 23 pages.

\* cited by examiner

*Primary Examiner* — Long Pham
(74) *Attorney, Agent, or Firm* — Foley & Lardner LLP (57) ABSTRACT

A semiconductor package structure is provided. The semiconductor package structure includes a first device, a second device, and a shielding structure. The first device and the second device is one a first side of a substrate. The shielding structure includes a first portion and a second portion. The first portion is between the first device and the second device on the substrate, and the first portion includes a plurality of first shielding units arranged along a first direction. The second portion is between the first device and the second device, and the second portion includes a plurality of second shielding units arranged along a second direction different from the first direction. The second portion is configured as a first waveguide between the first device and the second device.

17 Claims, 11 Drawing Sheets

SHIELDING STRUCTURE, SEMICONDUCTOR PACKAGE STRUCTURE WITH SHIELDING STRUCTURE

BACKGROUND

1. Technical Field

The present disclosure relates generally to a shielding structure. More particularly, the present disclosure relates to a shielding structure of a semiconductor package structure.

2. Description of the Related Art

A semiconductor package structure may include a plurality of electronic components. However, interference between adjacent electronic components may adversely affect the performance of the semiconductor package structure. A shielding structure may be needed to provide shielding effectiveness for the adjacent electronic components.

SUMMARY

In one or more embodiments, a semiconductor package structure includes a first device, a second device, and a shielding structure. The first device and the second device is one a first side of a substrate. The shielding structure includes a first portion and a second portion. The first portion is between the first device and the second device on the substrate, and the first portion includes a plurality of first shielding units arranged along a first direction. The second portion is between the first device and the second device, and the second portion includes a plurality of second shielding units arranged along a second direction different from the first direction. The second portion is configured as a first waveguide between the first device and the second device.

In one or more embodiments, a shielding structure includes a first portion and a second portion. The first portion is disposed on a substrate. The second portion is disposed on the substrate and angled with the first portion. An attenuation of a range of predetermined frequencies resulted from the first portion and the second portion is greater than 20 dB.

In one or more embodiments, a shielding structure includes a first portion and a second portion. The first portion is disposed on a substrate. The second portion is disposed on the substrate and angled with the first portion. The second portion includes a first extending portion and a second extending portion spaced apart from the first extending portion by a first distance. A ratio of a length of the second portion to the first distance is from about 1.4 to about 1.8.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
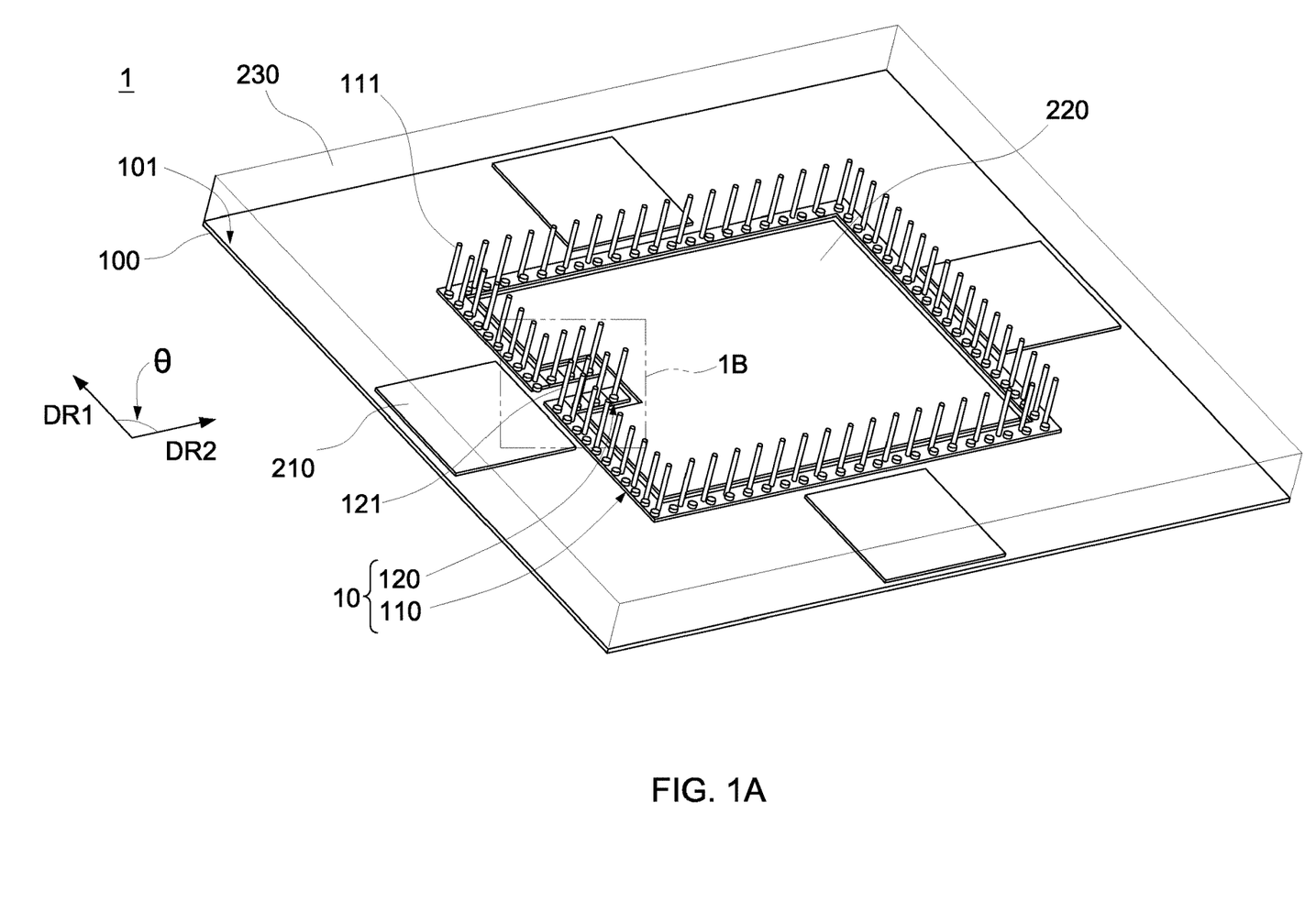
FIG. 1A illustrates a schematic diagram of a semiconductor package structure including a shielding structure in accordance with some embodiments of the present disclosure.

FIG. 1A illustrates a schematic diagram of a semiconductor package structure 1 including a shielding structure 10 in accordance with some embodiments of the present disclosure. The semiconductor package structure 1 includes a substrate 100, the shielding structure 10, devices 210 and 220, and an encapsulant 230.

The substrate 100 may include, for example, a printed circuit board, such as a paper-based copper foil laminate, a composite copper foil laminate, or a polymer-impregnated glass-fiber-based copper foil laminate. The substrate 100 may include an interconnection structure, such as a redistribution layer (RDL) or a grounding element.

The devices 210 and 220 are disposed on a surface 101 of the substrate 100. The shielding structure 10 is between the device 210 and the device 220. In some embodiments, the device 210 is located outside of the shielding structure 10.

In some embodiments, the device 220 is substantially surrounded by the shielding structure 10 from all sides. In some embodiments, the device 210 includes an antenna. In some embodiments, the antenna is configured to be operated at a frequency ranging from 0.4 GHz to about 4 GHz. In some embodiments, the antenna is configured to be operated at a frequency of about 2.4 GHz. In some embodiments, the device 210 includes a radio frequency (RF) integrated circuit operated at the aforesaid frequency ranges. In some embodiments, the device 220 includes an RF component. The shielding structure 10 can shield the device 220 from signals outside of the shielding structure 10. In some embodiments, the shielding structure 10 is configured as a waveguide between the device 210 and the device 220, forbidding propagation of electromagnetic wave lower than a predetermined frequency. In some embodiments, the predetermined frequency may be from 0.4 GHz to about 4 GHz. In some embodiments, the predetermined frequency may be about 2.4 GHz.

The encapsulant 230 is disposed on the surface 101 of the substrate 100. In some embodiments, the encapsulant 230 covers the devices 210 and 220 on the surface 101 of the substrate 100. The encapsulant 230 may include an epoxy resin having fillers, a molding compound (e.g., an epoxy molding compound or other molding compound), a polyimide, a phenolic compound or material, a material with a silicone dispersed therein, or a combination thereof.

Figure 1B:
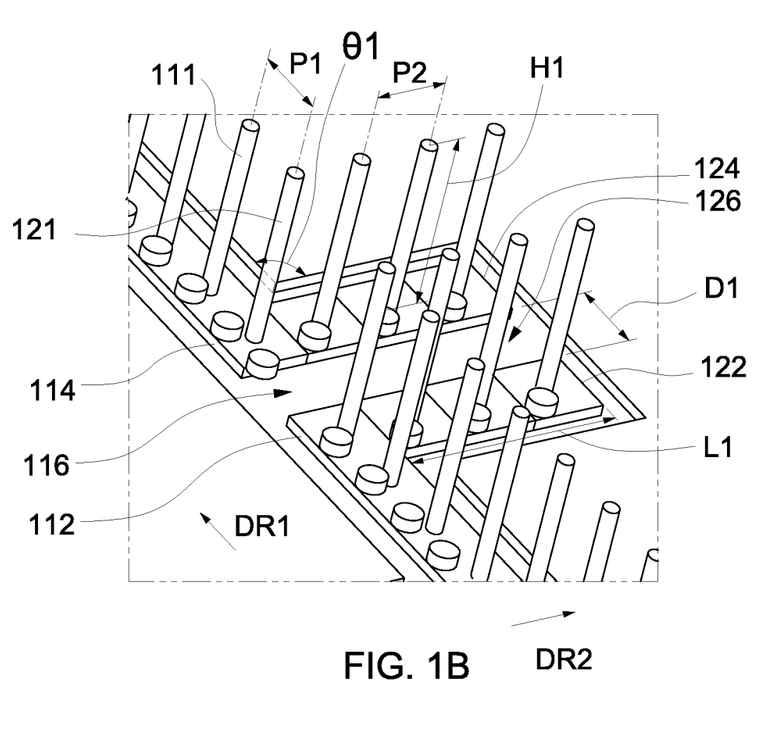
FIG. 1B illustrates a schematic diagram of a portion of a shielding structure in accordance with some embodiments of the present disclosure.

FIG. 1B illustrates a schematic diagram of a portion of a shielding structure 10 in accordance with some embodiments of the present disclosure. For example, FIG. 1B may be an enlarged view of the structure in the dashed box 1B as shown in FIG. 1A according to some embodiments of the present disclosure.

The shielding structure 10 may include portions 110 and 120. In some embodiments, the portions 110 and 120 of the shielding structure 10 may be made of or include, for example, aluminum (Al), copper (Cu), chromium (Cr), tin (Sn), gold (Au), silver (Ag), nickel (Ni) or stainless steel, or a mixture, an alloy, or other combination thereof.

Referring to FIG. 1A and FIG. 1B, the portion 110 of the shielding structure 10 is between the device 210 and the device 220 on the surface 101 of the substrate 100. In some embodiments, the portion 110 includes a plurality of shielding units 111 arranged along a direction DR1. In some embodiments, the shielding units 111 include shielding pillars and/or shielding wires (e.g., wire-bonds). In some embodiments, the portion 110 has an opening 116 defined by two ends 112 and 114 of the portion 110. In the embodiments of the present disclosure, the opening 116 is defined as being greater than the pitch of the shielding units 111. In some embodiments, the opening 116 is less than 1.5 times the pitch of the shielding units 111. In some embodiments, the opening 116 is from about 220 μm to about 320 μm.

Referring to FIG. 1A and FIG. 1B, the portion 120 of the shielding structure 10 is between the device 210 and the device 220. In some embodiments, the portion 120 is disposed on the substrate 100 and angled with the portion 110. In some embodiments, the portion 120 includes a plurality of shielding units 121 arranged along a direction DR2 different from the direction DR1. In some embodiments, the shielding units 121 include shielding pillars and/or shielding wires (e.g., wire-bonds). In some embodiments, the portion 120 is configured as a waveguide between the device 210 and the device 220, forbidding propagation of electromagnetic wave lower than a predetermined frequency. In some embodiments, the predetermined frequency may be from 0.4 GHz to about 4 GHz. In some embodiments, the predetermined frequency may be about 2.4 GHz.

In some embodiments, an inclusive angle θ1 between the direction DR1 and the direction DR2 is less than about 180°. In some embodiments, the inclusive angle θ1 between the direction DR1 and the direction DR2 is from about 850 to about 95°. In some embodiments, the inclusive angle θ1 between the direction DR1 and the direction DR2 is substantially 90°.

In the cases where wire-bonds are used as shielding units to surround a RF component, certain signals with specific frequency ranges generated at the surrounding may be blocked from being interfered with the RF component. However, since signals at relatively low frequency ranges have stronger transmittance, wire-bonds cannot effectively block signals at relatively low frequency ranges. For example, signals from an antenna are at relatively low frequency ranges and may not be blocked to a satisfactory extent by the shielding structure composed of wire-bonds. According to some embodiments of the present disclosure, the portion 120 of the shielding structure 10 is configured as a waveguide with a specific cut-off frequency characteristic between the devices 210 and 220, and thus the portion 120 can forbid propagation of electromagnetic wave (e.g., signals) at a predetermined frequency ranges, for example, the frequency ranges that the surrounding devices are operating at.

In some embodiments, the aforesaid waveguide with a specific cut-off frequency characteristic can effectively attenuate the intensity of electromagnetic waves within a range of the predetermined frequencies. In some embodiments, an attenuation of a range of the predetermined frequencies resulted from the portion 110 and the portion 120 is greater than about 15 dB. In some embodiments, an attenuation of a range of the predetermined frequencies resulted from the portion 110 and the portion 120 is greater than about 17 dB. In some embodiments, an attenuation of a range of the predetermined frequencies resulted from the portion 110 and the portion 120 is greater than about 20 dB.

In some embodiments, the portion 120 includes an extending portion 122 and an extending portion 124 spaced apart from the extending portion 122 by a distance D1 along the direction DR1. In some embodiments, a ratio of a length L1 of the portion 120 to the distance D1 is from about 1.4 to about 1.8. In some embodiments, a ratio of a length L1 of the portion 120 to the distance D1 is equal to or greater than about 1.5. In some embodiments, the ratio of the length L1 of the portion 120 to the distance D1 is from about 1.5 to about 1.7. In some embodiments as shown in FIGS. 1A-1B, each of the extending portions 122 and 124 includes three shielding units along the direction DR2, and the ratio of the length L1 to the distance D1 is about 1.5-1.8.

In some embodiments, the portion 120 has a channel 126 connected to the opening 116 of the portion 110. In some embodiments, the two extending portions 122 and 124 of the portion 120 are connected to the two ends 112 and 114 of the portion 110, respectively. In some embodiments, a ratio of a width (i.e. the distance D1) of the channel 126 to a length (i.e. the length L1) of the channel 126 is from about 1.4 to about 1.8. In some embodiments as shown in FIGS. 1A-1B, a ratio of the width (i.e. the distance D1) of the channel 126 to the length (i.e. the length L1) of the channel 126 is about 1.6-1.8.

In some embodiments, a density of the shielding units 111 of the portion 110 is greater than a density of the shielding units 121 of the portion 120. In some embodiments, a pitch P1 of the shielding units 111 is smaller than a pitch P2 of the shielding units 121. In some embodiments, the shielding units 111 and 121 are shielding pillars, and the pitch P1 and the pitch P2 are defined as the distance between two adjacent shielding pillars at the portion 110 and the portion 120, respectively.

Referring to FIG. 1A, in some embodiments, the device 220 is substantially surrounded by the portions 110 and 120 from all sides. In some embodiments, the portion 110 substantially surrounds all sides of the device 220, and the channel 126 of the portion 120 connects the device 220 and the device 210 outside of the portion 110.

Figure 2A:
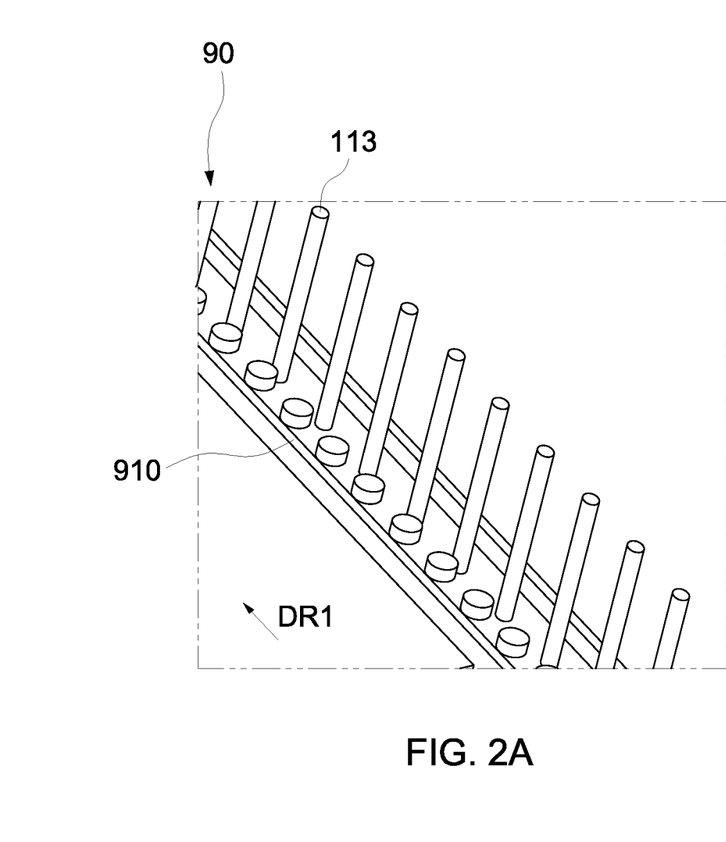
FIG. 2A illustrates a schematic diagram of a portion of a shielding structure in accordance with some comparative embodiments of the present disclosure.

FIG. 2A illustrates a schematic diagram of a portion of a shielding structure 90 in accordance with some comparative embodiments of the present disclosure. For example, FIG. 2A may be an enlarged view of a comparative embodiment structure in the dashed box 1B as shown in FIG. 1A according to some comparative embodiments of the present disclosure.

The shielding structure 90 only includes a portion 910, and the portion 910 includes a plurality of shielding units 113. The shielding units 113 may be wire-bonds and/or pillars. The shielding structure 90 does not include another portion angled with the portion 910. The portion 910 does not having any opening.

Figure 2B:
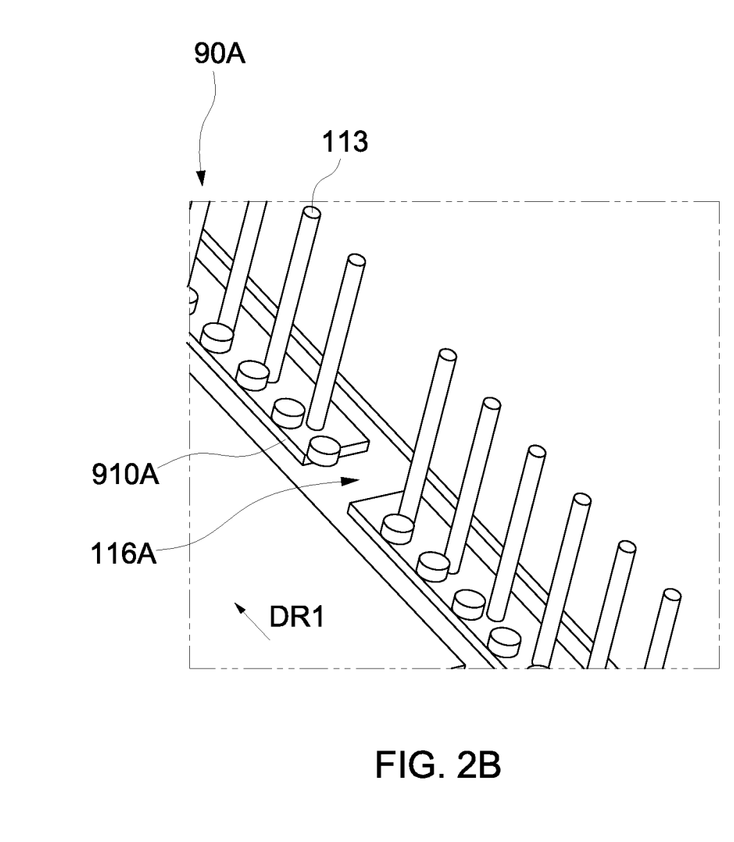
FIG. 2B illustrates a schematic diagram of a portion of a shielding structure in accordance with some comparative embodiments of the present disclosure.

FIG. 2B illustrates a schematic diagram of a portion of a shielding structure 90A in accordance with some comparative embodiments of the present disclosure. For example, FIG. 2B may be an enlarged view of a comparative embodiment structure in the dashed box 1B as shown in FIG. 1A according to some comparative embodiments of the present disclosure.

The shielding structure 90A only includes a portion 910A, and the portion 910A includes a plurality of shielding units 113. The shielding units 113 may be wire-bonds and/or pillars. The portion 910A has an opening 116A. The shielding structure 90A does not include another portion angled with the portion 910. The shielding structure 90A does not include another portion having a channel connected to the opening 116A.

Figure 2C:
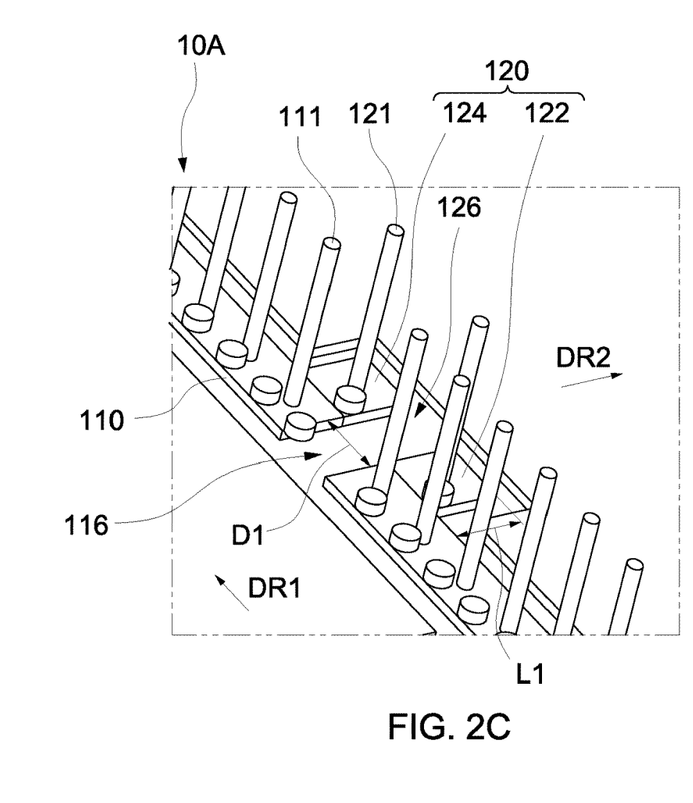
FIG. 2C illustrates a schematic diagram of a portion of a shielding structure in accordance with some embodiments of the present disclosure.

FIG. 2C illustrates a schematic diagram of a portion of a shielding structure 10A in accordance with some embodiments of the present disclosure. For example, FIG. 2C may be an enlarged view of one of various possible structures in the dashed box 1B as shown in FIG. 1A according to some embodiments of the present disclosure. The shielding structure 10A shown in FIG. 2C is similar to the shielding structure 10 shown in FIGS. 1A-1B except that, for example, the length L1 of the portion 120 along the direction DR2 is different.

In some embodiments, each of the extending portions 122 and 124 includes one shielding unit 121. In some embodiments, the ratio of the length L1 of the portion 120 along the direction DR2 to the distance D1 between the extending portions 122 and 124 is equal to or greater than about 1.5. In some embodiments as shown in FIG. 2C, a ratio of the width (i.e. the distance D1) of the channel 126 to the length (i.e. the length L1) of the channel 126 is about 1.4-1.6.

Figure 2D:
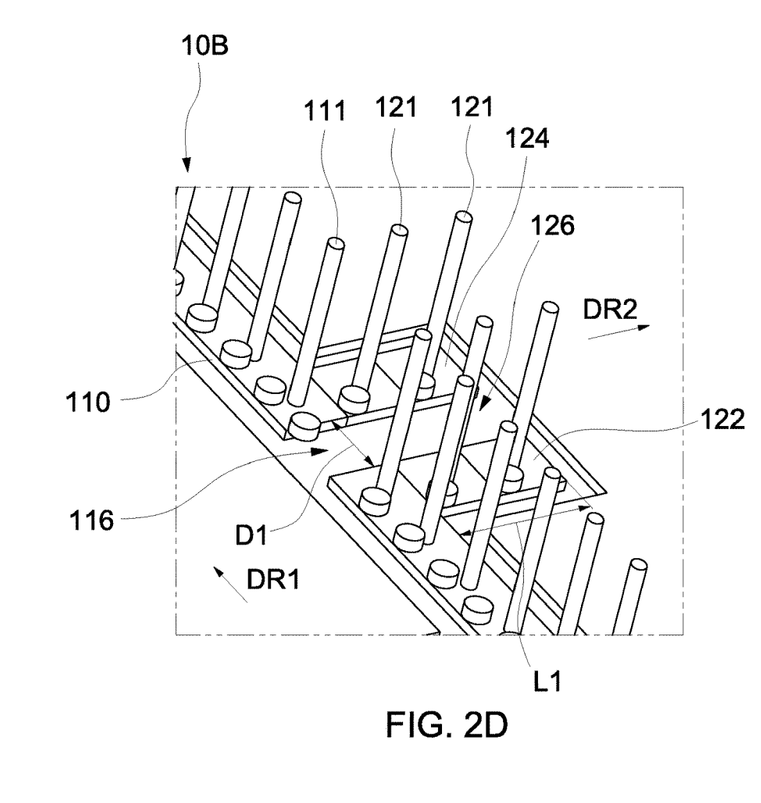
FIG. 2D illustrates a schematic diagram of a portion of a shielding structure according to some embodiments of the present disclosure.

FIG. 2D illustrates a schematic diagram of a portion of a shielding structure 10B according to some embodiments of the present disclosure. For example, FIG. 2D may be an enlarged view of one of various possible structures in the dashed box 1B as shown in FIG. 1A according to some embodiments of the present disclosure. The shielding structure 10B shown in FIG. 2D is similar to the shielding structure 10 shown in FIGS. 1A-1B except that, for example, the length L1 of the portion 120 along the direction DR2 is different.

In some embodiments, each of the extending portions 122 and 124 includes two shielding units 121. In some embodiments, the ratio of the length L1 of the portion 120 along the direction DR2 to the distance D1 between the extending portions 122 and 124 is about 1.6-1.8. In some embodiments as shown in FIG. 2C, a ratio of the width (i.e. the distance D1) of the channel 126 to the length (i.e. the length L1) of the channel 126 is about 1.6-1.8. In some embodiments, the width (i.e. the distance D1) of the channel 126 is about 270 µm, and the length (i.e. the length L1) of the channel 126 is about 430 µm.

Figure 3A:
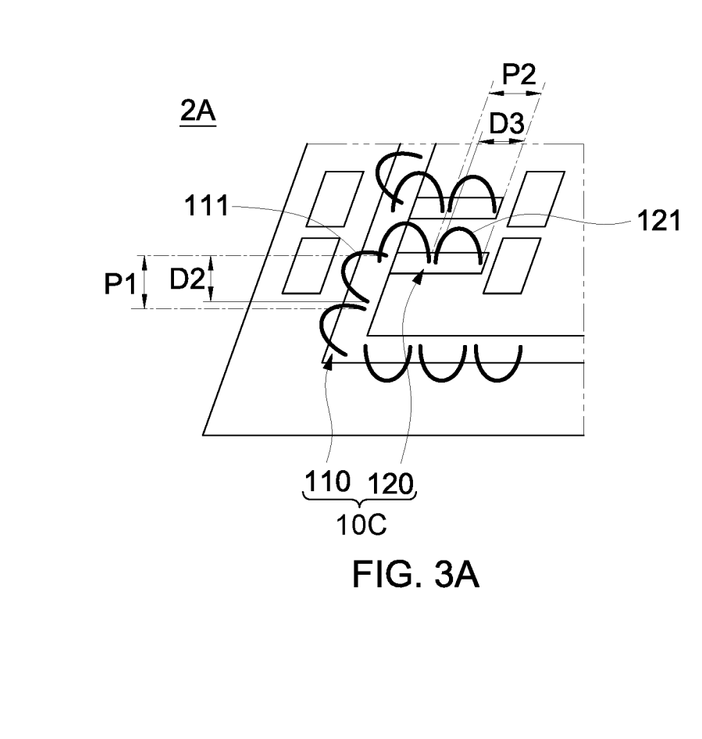
FIG. 3A illustrates a schematic diagram of a region of a semiconductor package structure including a shielding structure in accordance with some embodiments of the present disclosure.

FIG. 3A illustrates a schematic diagram of a region of a semiconductor package structure 2A including a shielding structure 10C in accordance with some embodiments of the present disclosure.

In some embodiments, the shielding units 111 include shielding wires (e.g., wire-bonds). In some embodiments, the shielding units 121 include shielding wires (e.g., wire-bonds). In some embodiments, each of the shieling wires (i.e. the shielding units 111) of the portion 110 includes two ends bonded to the substrate 100, and a distance D2 between the two ends of each of the shielding wires is from about 120 µm to about 180 µm. In some embodiments, each of the shieling wires (i.e. the shielding units 121) of the portion 120 includes two ends bonded to the substrate 100, and a distance D3 between the two ends of each of the shielding wires is from about 120 µm to about 180 µm.

In some embodiments, as shown in FIG. 3A, the pitch P1/P2 is defined as the distance between one end of a shielding wire and one end of an adjacent shielding wire. In some embodiments, the pitch P1 of the shielding wires (i.e. the shielding units 111) of the portion 110 is from about 220 µm to about 280 µm. In some embodiments, the pitch P2 of the shielding wires (i.e. the shielding units 121) of the portion 120 is from about 220 µm to about 280 µm.

Figure 3B:
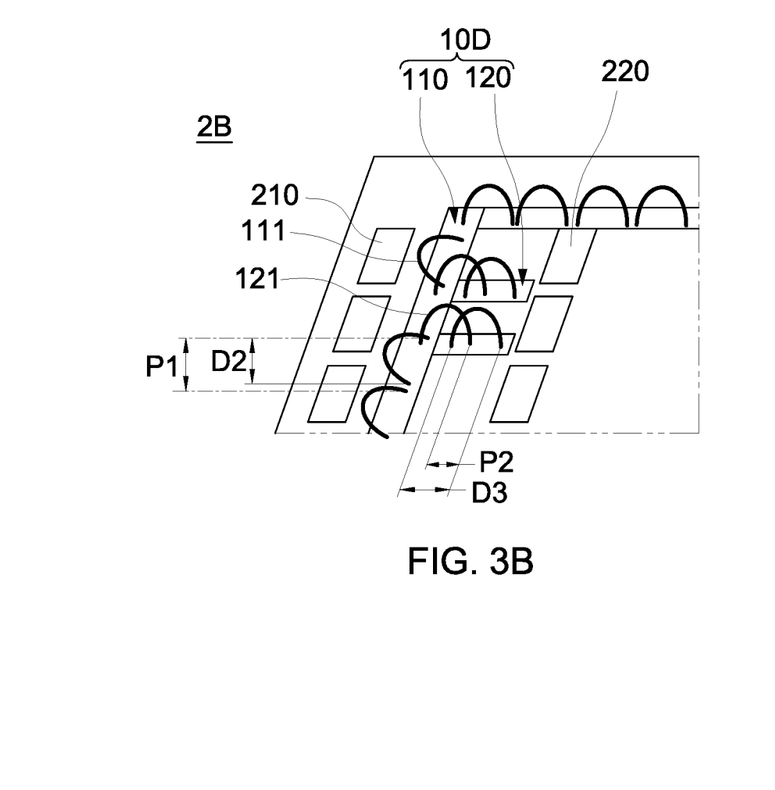
FIG. 3B illustrates a schematic diagram of a region of a semiconductor package structure including a shielding structure in accordance with some embodiments of the present disclosure.

FIG. 3B illustrates a schematic diagram of a region of a semiconductor package structure 2B including a shielding structure 10D in accordance with some embodiments of the present disclosure.

In some embodiments, the shielding units 111 include shielding wires (e.g., wire-bonds). In some embodiments, the shielding units 121 include shielding wires (e.g., wire-bonds). In some embodiments, the adjacent shielding wires (i.e., the shielding units 121) of the portion 120 may overlap. In some embodiments, the adjacent shielding wires of the portion 110 may overlap (not shown in FIG. 3B). In some embodiments, an end of one of the shielding wires (i.e., the shielding units 121) of the portion 120 is located between two ends of an adjacent shielding wire (i.e., the shielding unit 121) of the portion 120. In some embodiments, the distance D3 between two ends of each of the shielding wires (i.e., the shielding units 121) of the portion 120 is from about 100 µm to about 150 µm.

In some embodiments, the pitch P1 of the shielding wires (i.e. the shielding units 111) of the portion 110 is from about 220 µm to about 280 µm. In some embodiments, the pitch P2 of the shielding wires (i.e. the shielding units 121) of the portion 120 is from about 100 µm to about 280 µm.

Figure 4A:
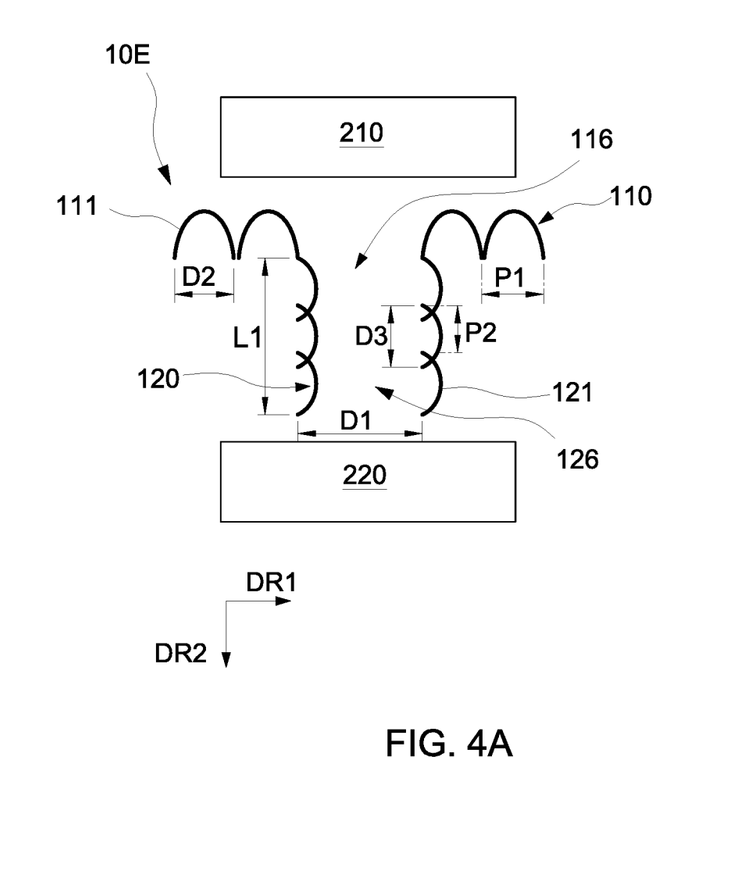
FIG. 4A illustrates a schematic diagram of a shielding structure disposed between two devices in accordance with some embodiments of the present disclosure.

FIG. 4A illustrates a schematic diagram of a shielding structure 10E disposed between two devices 210 and 220 in accordance with some embodiments of the present disclosure.

The shielding structure 10E is between the device 210 and the device 220. In some embodiments, the shielding units 111 of the portion 110 of the shielding structure 10E include shielding wires (e.g., wire-bonds). In some embodiments, the shielding units 121 of the portion 120 of the shielding structure 10E include shielding wires (e.g., wire-bonds).

In some embodiments, the distance D2 between two ends of each of the shielding wires (i.e., the shielding units 111) of the portion 110 is from about 120 µm to about 180 µm. In some embodiments, the pitch P1 of the shielding wires (i.e., the shielding units 111) of the portion 110 is from about 220 µm to about 280 µm. In some embodiments, the distance D3 between two ends of each of the shielding wires (i.e., the shielding units 121) of the portion 120 is from about 120 µm to about 180 µm. In some embodiments, the pitch P2 of the shielding wires (i.e., the shielding units 121) of the portion 120 is from about 220 µm to about 280 µm. In some embodiments, a width (i.e. the distance D1) of the channel 126 is from about 220 µm to about 320 µm. In some embodiments, the width (i.e. the distance D1) of the channel 126 is about 270 m. In some embodiments, a ratio (D1/L1) of the width (i.e. the distance D1) to the length L1 of the portion 120 is up to about 0.3.

Figure 4B:
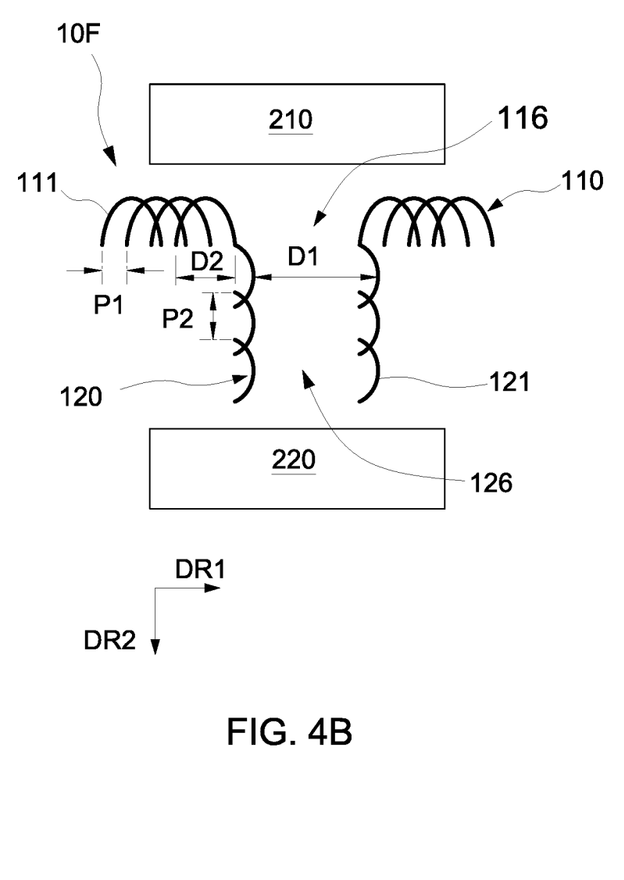
FIG. 4B illustrates a schematic diagram of a shielding structure disposed between two devices in accordance with some embodiments of the present disclosure.

FIG. 4B illustrates a schematic diagram of a shielding structure 10F disposed between two devices 210 and 220 in accordance with some embodiments of the present disclosure.

In some embodiments, the adjacent shielding wires (i.e., the shielding units 111) of the portion 110 may overlap. In some embodiments, the distance D2 between two ends of each of the shielding wires (i.e., the shielding units 111) of the portion 110 is from about 100 µm to about 150 µm. In some embodiments, the pitch P1 of the shielding wires (i.e. the shielding units 111) of the portion 110 is from about 100 µm to about 280 µm.

Figure 4C:
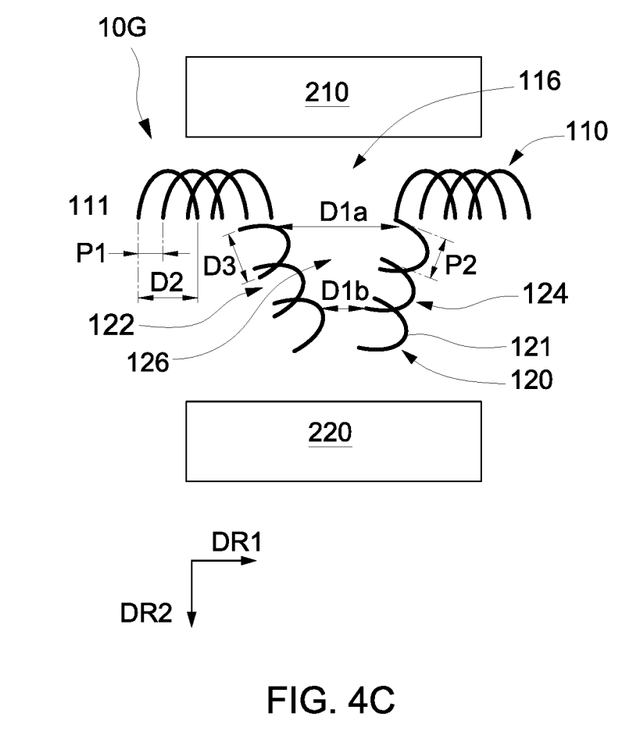
FIG. 4C illustrates a schematic diagram of a shielding structure disposed between two devices in accordance with some embodiments of the present disclosure.

FIG. 4C illustrates a schematic diagram of a shielding structure 10G disposed between two devices 210 and 220 in accordance with some embodiments of the present disclosure.

In some embodiments, the distance between the extending portion 122 and the extending portion 124 of the portion 120 of the shielding structure 10G varies along the direction DR2. In some embodiments, the distance between the extending portion 122 and the extending portion 124 of the portion 120 of the shielding structure 10G decreases along the direction DR2. In some embodiments, the distance between the extending portion 122 and the extending portion 124 of the portion 120 of the shielding structure 10G decreases towards away from the portion 110 along the direction DR2.

In some embodiments, the width of the channel 126 defined by the extending portion 122 and the extending portion 124 varies along the direction DR2. In some embodiments, the width of the channel 126 defined by the extending portion 122 and the extending portion 124 decreases along the direction DR2. In some embodiments, the width of the channel 126 defined by the extending portion 122 and the extending portion 124 decreases towards away from the portion 110 along the direction DR2. For example, the channel 126 has a width D1a proximal to the portion 110 and a width D1b distal to the portion 110, and the width D1a is different from the width D1b. In some embodiments, the width D1b is smaller than the width D1a. Due to the reduced width D1b of the channel 126 at the end distal to the portion 110, i.e., a smaller pitch of the shielding units 121 at the end distal to the portion 110, the shielding effectiveness is increased compared to that having the channel 126 with a constant width D1a. In addition, the shielding structure 10G with the channel 126 having a decreased width along the direction DR2, therefore the shielding performance can be improved even at relatively high frequencies. Moreover, the cut-off frequency of the shielding structure 10G may be adjusted according to actual needs by varying the width D1b of the channel 126, thus the applicable ranges and selections of the shielding frequencies can be widen without increasing the complexity of manufacturing process of the shielding structure 10G.

Figure 5A:
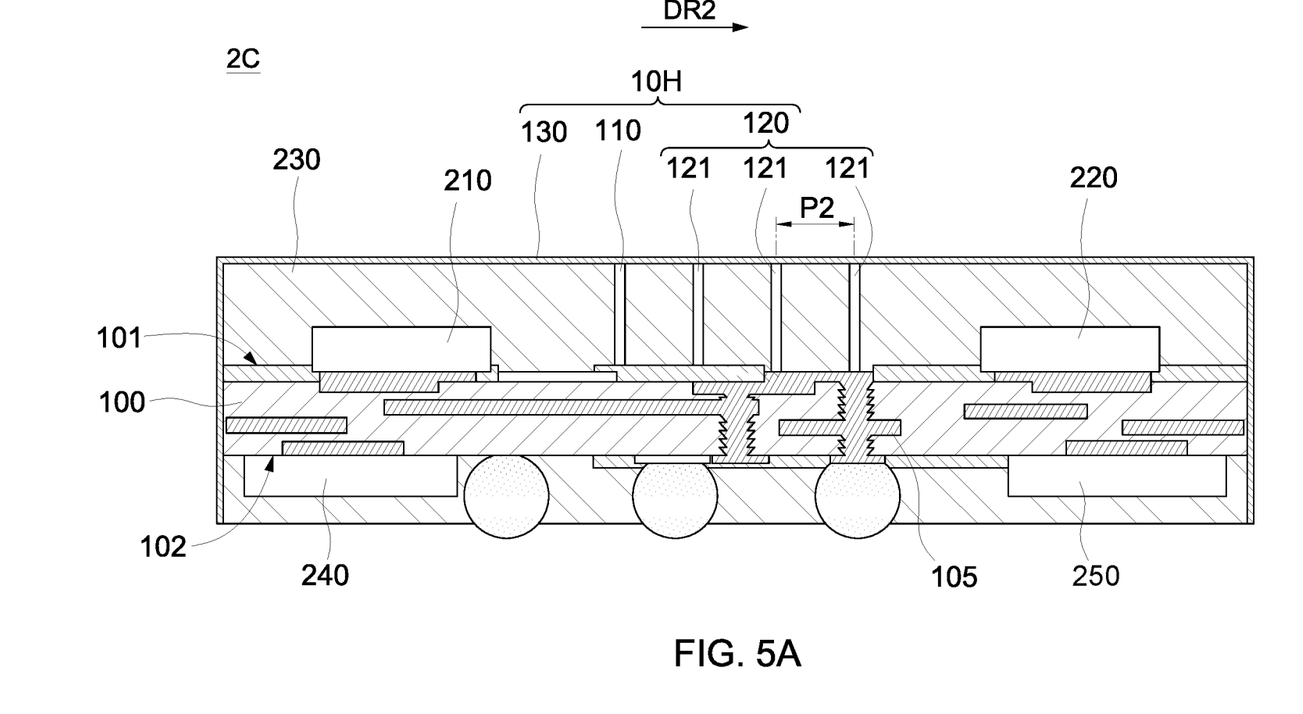
FIG. 5A illustrates a cross-sectional view of a semiconductor package structure including a shielding structure in accordance with some embodiments of the present disclosure.

FIG. 5A illustrates a cross-sectional view of a semiconductor package structure 2C including a shielding structure 10H in accordance with some embodiments of the present disclosure.

The shielding structure 10H may further include a shielding layer 130. The shielding layer 130 may be electrically connected to the portion 110. The shielding layer 130 may be electrically connected to the portion 120. In some embodiments, the shielding layer 130 is disposed over and in direct contact with the portion 110. In some embodiments, the shielding layer 130 is disposed over and in direct contact with the portion 120. In some embodiments, the shielding layer 130 is a conformal shielding layer. In some embodiments, the shielding layer 130 may be made of or include, for example, aluminum (Al), copper (Cu), chromium (Cr), tin (Sn), gold (Au), silver (Ag), nickel (Ni) or stainless steel, or a mixture, an alloy, or other combination thereof. In some embodiments, the shielding layer 130 may have a thickness of equal to or greater than 3 µm. In some embodiments, the shielding layer 130 may have a thickness from about 4 µm to about 5 µm.

In some embodiments, the portion 120 includes three shielding pillars (i.e., the shielding units 121) arranged along the direction DR2. In some embodiments, the portion 120 of the shielding structure 10H may further include a redistribution layer (RDL) 105 in the substrate 100.

In some embodiments, the substrate 100 has a surface 102 opposite to the surface 101. In some embodiment, the semiconductor package structure 2C may further include a device 240 on the surface 102 of the substrate 100. In some embodiment, the semiconductor package structure 2C may further include a device 250 on the surface 102 of the substrate 100. In some embodiments, the RDL 105 in the substrate 100 can be disposed between the devices at the surface 101 of the substrate 100 and the devices at the surface 102 of the substrate 100. In some embodiments, the RDL 105 may include specific arrangement of conductive vias in different layers so that a channel-like structure can be formed between the devices at the surface 101 and the devices at the surface 102. By having the RDL 105 configured as a waveguide with specific cut-off frequency, interference between the devices at the surface 101 and the devices at the surface 102 can be effectively reduced. In some embodiments, the encapsulant 230 further covers the device 240 and the device 250 and form a double side molding package structure.

Figure 5B:
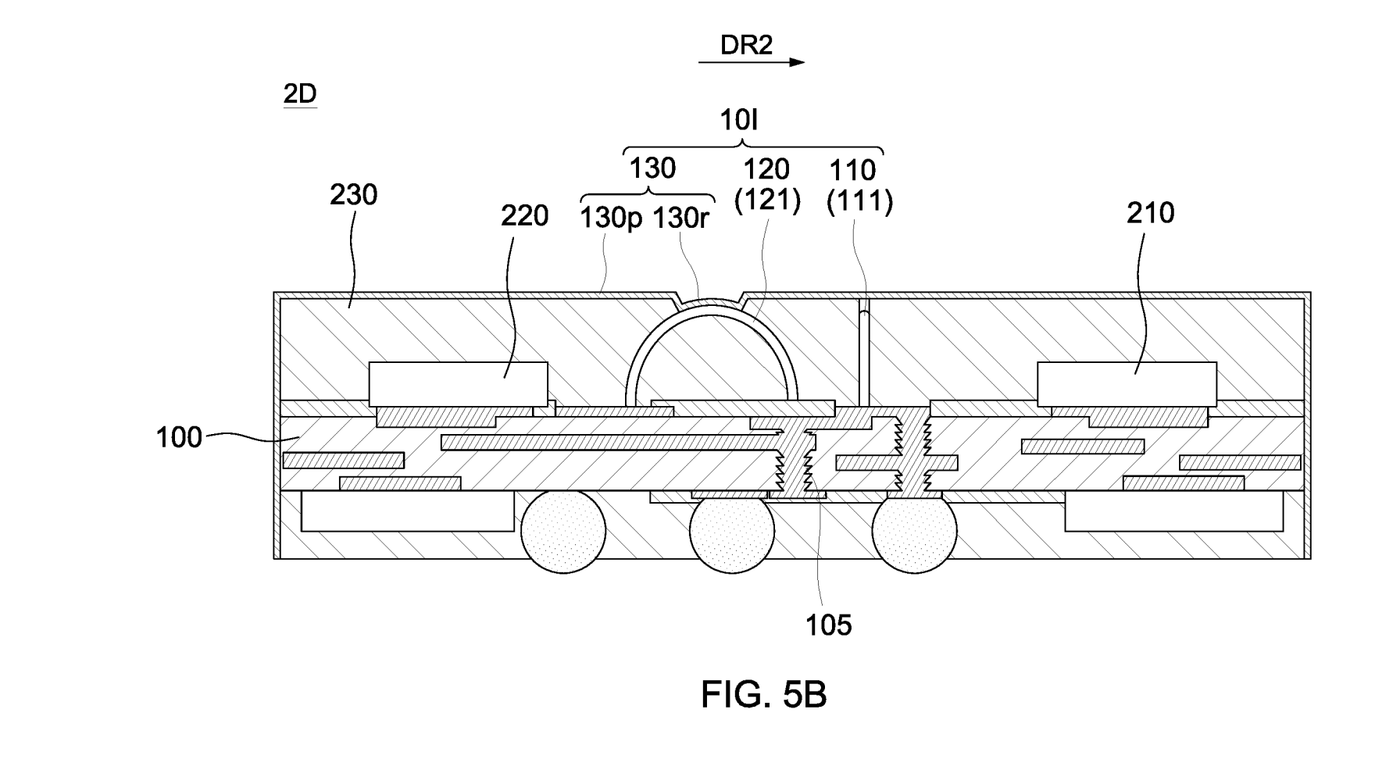
FIG. 5B illustrates a cross-sectional view of a semiconductor package structure including a shielding structure in accordance with some embodiments of the present disclosure.

FIG. 5B illustrates a cross-sectional view of a semiconductor package structure 2D including a shielding structure 10I in accordance with some embodiments of the present disclosure.

The shielding units 121 of the portion 120 of the shielding structure 10I may be shielding wires. The shielding units 111 of the portion 110 of the shielding structure 10I may be shielding wires (not shown in FIG. 5B). In some embodiments, the shielding layer 130 is disposed over and in direct contact with a top portion of at least one of the shielding wires (i.e., the shielding units 111 and/or the shielding units 121). In some embodiments, the shielding layer 130 is conformal with the top portion of at least one of the shielding wires (i.e., the shielding units 111 and/or the shielding units 121).

In some embodiments, the shielding layer 130 has a recessed portion 130r and a planar portion 130p connected to the recessed portion 130r. The recessed portion 130r of the shielding layer 130 has a concave upper surface. The planar portion 130p of the shielding layer 130 has a substantially planar upper surface. The upper surface of the recessed portion 130r of the shielding layer 130 is non-planar with the upper surface of the planar portion 130p of the shielding layer 130.

In some embodiments, the recessed portion 130r of the shielding layer 130 is in direct contact with the top portion of the at least one of the shielding wires (i.e., the shielding units 111) of the portion 110 of the shielding structure 10I. In some embodiments, the recessed portion 130r of the shielding layer 130 is in direct contact with the top portion of the at least one of the shielding wires (i.e., the shielding units 121) of the portion 120 of the shielding structure 10I. In some embodiments, the recessed portion 130r of the shielding layer 130 is conformal with and in direct contact with a curved portion of the portion 110 of the shielding structure 10I (not shown in FIG. 5B). In some embodiments, the recessed portion 130r of the shielding layer 130 is conformal with and in direct contact with a curved portion of the portion 120 of the shielding structure 10I.

Figure 6:
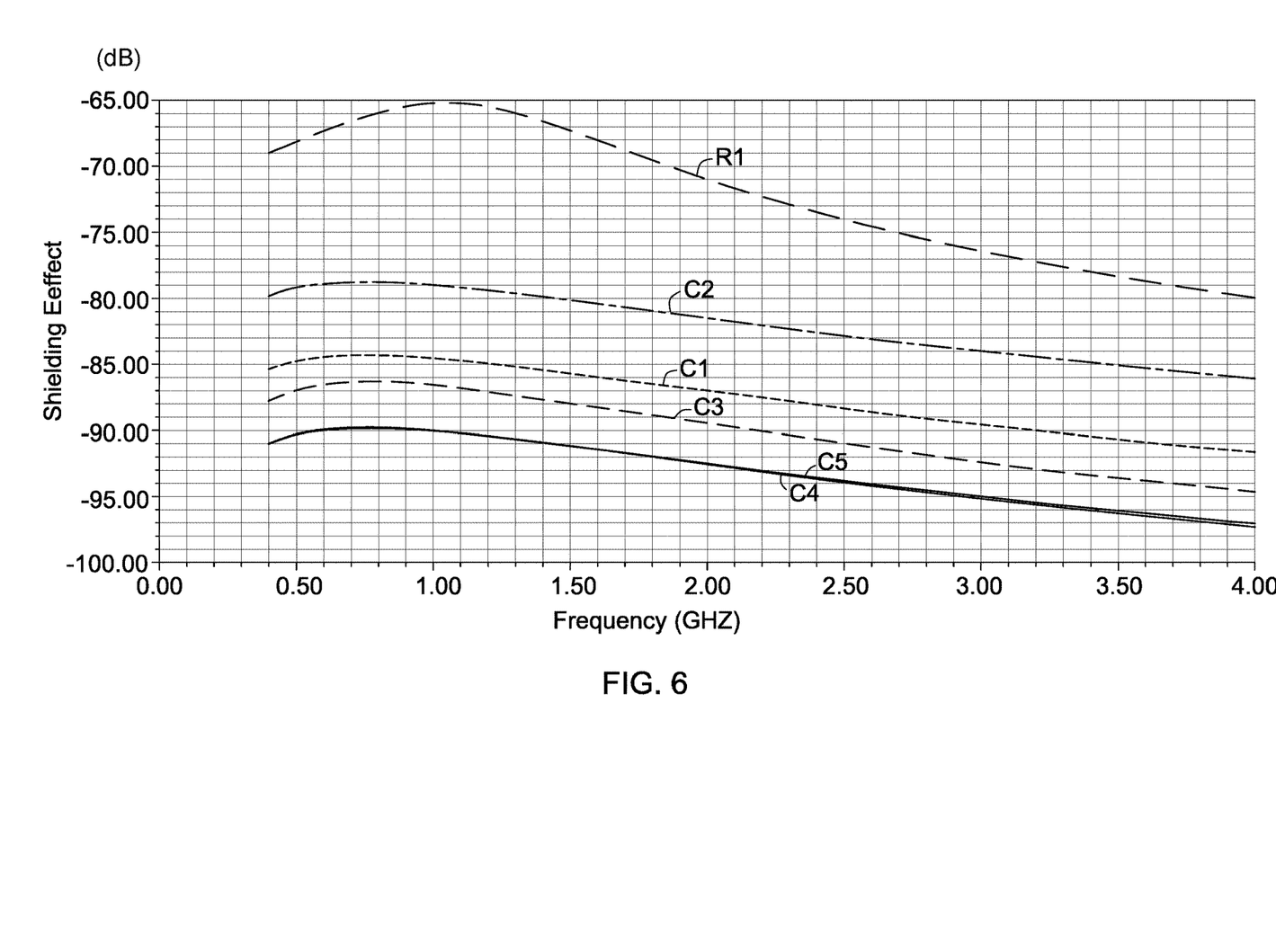
FIG. 6 shows simulations of shielding effectiveness of the shielding structures in accordance with some embodiments of the present disclosure.

FIG. 6 shows simulations of shielding effectiveness of the shielding structures in accordance with some embodiments and comparative embodiments of the present disclosure. The curve R1 shows the shielding effectiveness simulation of a semiconductor package structure having a structure similar to that of the semiconductor package structure 1 shown in FIG. 1A but having no shielding structure. The curve C1 shows the shielding effectiveness simulation of a semiconductor package structure having a structure similar to that of the semiconductor package structure 1 shown in FIG. 1A but having the shielding structure 90 shown in FIG. 2A. The curve C2 shows the shielding effectiveness simulation of a semiconductor package structure having a structure similar to that of the semiconductor package structure 1 shown in FIG. 1A but having the shielding structure 90A shown in FIG. 2B. The curve C3 shows the shielding effectiveness simulation of a semiconductor package structure having a structure similar to that of the semiconductor package structure 1 shown in FIG. 1A but having the shielding structure 10A shown in FIG. 2C. The curve C4 shows the shielding effectiveness simulation of a semiconductor package structure having a structure similar to that of the semiconductor package structure 1 shown in FIG. 1A but having the shielding structure 10B shown in FIG. 2D. The curve C5 shows the shielding effectiveness simulation of the semiconductor package structure 1 shown in FIG. 1A having the shielding structure 10. In these simulations, the following parameters were adopted. The shielding pillars are formed of copper, the pitch between the shielding pillars is about 150 μm, the diameter of each of the shielding pillars is about 1.2 mil, the total thickness of the semiconductor package structure 1 is about 0.432 mm, and the thickness of the encapsulant is about 0.370 mm. The simulations were performed using Ansys HFSS 2019 r3.

X axis of the simulation shown in FIG. 6 shows the operating frequencies (GHz), and Y-axis of the same shows the simulation parameter (dB). Each of the curves R1, C1, C2, C3, C4, and C5 shows the simulation parameter against respective operating frequencies.

Table 1 shows the shielding effectiveness of the embodiments/comparative embodiments represented by the curves C1-C5 at operating frequency 2.4 GHz. The values of shielding effectiveness (SE) were obtained by subtracting the negative simulation parameter of the curve R1 from the negative simulation parameter of any of the curves C1 to C4 at operating frequency 2.4 GHz.

TABLE 1

|  | C1@2.4 GHz (shielding structure 90) | C2@2.4 GHz (shielding structure 90A) | C3@2.4 GHz (shielding structure 10A) | C4@2.4 GHz (shielding structure 10B) | C5@2.4 GHz (shielding structure 10) |
|---|---|---|---|---|---|
| Shielding pillars | No portion 120 | No portion 120, portion 910A having an opening | Portion 120 including one pillar | Portion 120 including two pillars | Portion 120 including three pillars |
| SE | 14.56 dB | 9.00 dB | 17.18 dB | 20.16 dB | 20.02 dB |

As shown in FIG. 6 and Table 1, the shielding structure 90 does not have a portion angled with the portion 910 to serve as a waveguide, and the shielding effectiveness is lower than 15 dB, for example, 14.56 dB. In addition, the shielding structure 90A does not have a portion angled with the portion 910A to serve as a waveguide, and the shielding structure 90A further has an opening 116A, which even further decreases the shielding effectiveness to be lower than 10 dB, for example, 9.00 dB.

On the contrary, the results in FIG. 6 and Table 1 show that the shielding structures in accordance with the embodiments of the present disclosure are provided with shielding effectiveness (SE) of greater than 15 dB. For example, the shielding structures 10, 10A and 10B all have the portion 120 serving as a waveguide to cut off signals below the predetermined frequency, for example, from about 0.40 GHZ to about 4.00 GHz. The shielding effectiveness of the shielding structure 10A is greater than 15 dB, for example, 17.18 dB. The shielding effectiveness of the shielding structure 10 and 10B is greater than 20 dB, for example, 20.16 dB and 20.02 dB.

In addition, in the embodiments illustrated by the curves C3-C5, the numbers of the shielding units (e.g., shielding pillars) of the portion 120 being two or three generate similar shielding effectiveness. The above results indicate that the ratio (L1/D1) of the length L1 of the portion 120 to the distance D1 between the extending portions 122 and 124 being from about 1.4 to about 1.8 can be a preferred working range. Moreover, curves C4-C5 indicate that as long as the length of the channel 126 meets a certain requirement, further extending the length of the channel 126 does not provide better shielding effectiveness. Accordingly, an optimal number of shielding units 121 can be calculated to dispose along the channel 126, less layout space is occupied, and the cost is also reduced while a satisfying shielding effectiveness can be achieved.

Figure 7:
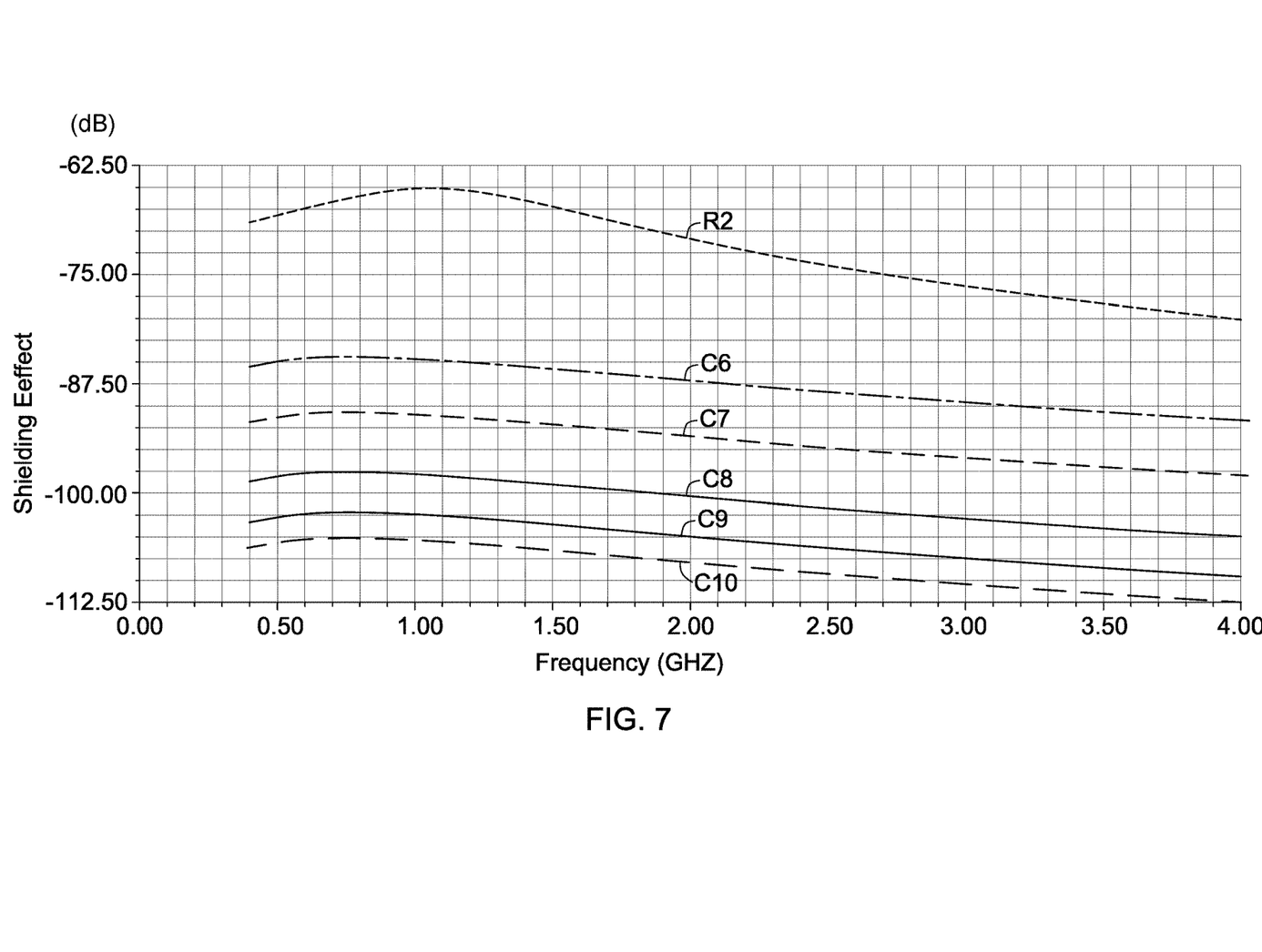
FIG. 7 shows simulations of shielding effectiveness of the shielding structures in accordance with some embodiments of the present disclosure.

FIG. 7 shows simulations of shielding effectiveness (SE) of the shielding structures in accordance with some embodiments of the present disclosure. The curve R2 shows the shielding effectiveness simulation of a semiconductor package structure having a structure similar to that the semiconductor package structure 1 shown in FIG. 1A but having no shielding structure. The curves C6-C10 shows the shielding effectiveness simulation of the shielding structure having a structure similar to that shielding structure 10 shown in FIG. 2A but having different pillar diameters and different pitches between the shielding pillars. In these simulations, the following parameters were adopted. The shielding pillars are formed of copper, the total thickness of the semiconductor package structure 1 is about 0.432 mm, and the thickness of the encapsulant is about 0.370 mm. The simulations were performed using Ansys HFSS 2019 r3.

Table 2 shows the pillar diameters, the pitches between shielding pillars, and the shielding effectiveness (SE) of the embodiments/comparative embodiments represented by the curves C6-C10 at operating frequency 2.4 GHz.

TABLE 2

|  | C6@2.4 GHz | C7@2.4 GHz | C8@2.4 GHz | C8@2.4 GHz | C10@2.4G Hz |
|---|---|---|---|---|---|
| Diameter of shielding pillars | 1.2 mil | 2.0 mil | 60 μm | 80 μm | 60 μm |
| Pitch between shielding pillars | 150 μm | 150 μm | 150 μm | 150 μm | 130 μm |
| SE | 16.01 dB | 22.37 dB | 29.29 dB | 36.71 dB | 33.84 dB |

The results in FIG. 7 and Table 2 show that the thicker the diameter of the shielding pillar, the greater the shielding effectiveness. In addition, the smaller the pitch between the shielding pillars, the greater the shielding effectiveness.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of said numerical value, such as less than or equal to +5%, less than or equal to +4%, less than or equal to +3%, less than or equal to +2%, less than or equal to ±1%, less than or equal to +0.5%, less than or equal to +0.1%, or less than or equal to +0.05%. For example, two numerical values can be deemed to be "substantially" or "about" the same if a difference between the values is less than or equal to ±10% of an average of the values, such as less than or equal to +5%, less than or equal to +4%, less than or equal to +3%, less than or equal to ±2%, less than or equal to +1%, less than or equal to +0.5%, less than or equal to +0.1%, or less than or equal to ±0.05%. For example, "substantially" parallel can refer to a range of angular variation relative to 0° that is less than or equal to ±10°, such as less than or equal to ±5°, less than or equal to +4°, less than or equal to +3°, less than or equal to +2°, less than or equal to +1, less than or equal to +0.5°, less than or equal to +0.1°, or less than or equal to +0.05°. For example, "substantially" perpendicular can refer to a range of angular variation relative to 900 that is less than or equal to ±10°, such as less than or equal to +5°, less than or equal to +4°, less than or equal to +3°, less than or equal to +2°, less than or equal to +1, less than or equal to +0.5°, less than or equal to +0.10, or less than or equal to +0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   a first device and a second device on a first side of a substrate;
   a shielding structure, comprising:

a first portion between the first device and the second device on the substrate, the first portion comprising a plurality of first shielding units arranged along a first direction; and a second portion between the first device and the second device, the second portion comprising a plurality of second shielding units arranged along a second direction different from the first direction, wherein the second portion is configured as a first waveguide between the first device and the second device; and wherein a pitch of the first shielding units is smaller than a pitch of the second shielding units.

2. The semiconductor package structure of claim 1, wherein a density of the first shielding units is greater than a density of the second shielding units.

3. The semiconductor package structure of claim 1, wherein an inclusive angle between the first direction and the second direction is from about 85° to about 95°.

4. The semiconductor package structure of claim 1, wherein the first device is substantially surrounded by the first portion and the second portion from all sides.

5. A shielding structure, comprising:
a first portion disposed on a substrate; and
a second portion disposed on the substrate and angled with the first portion, wherein an attenuation of a range of predetermined frequencies resulted from the first portion and the second portion is greater than 20 dB, wherein the range of predetermined frequencies is a frequency range at which surrounding devices are operating;

wherein the first portion has an opening defined by two ends of the first portion, the second portion has a channel connected to the opening of the first portion, the first portion surrounds all sides of a first device, and the channel of the second portion connects the first device and a second device outside of the first portion.

6. The shielding structure of claim 5, wherein the second portion comprises two extending portions defining the channel, and the two extending portions are connected to the two ends of the first portion, respectively.

7. A shielding structure, comprising:
a first portion disposed on a substrate; and
a second portion disposed on the substrate and angled with the first portion;

wherein the second portion comprises a first extending portion and a second extending portion spaced apart from the first extending portion by a first distance, and a ratio of a length of the second portion to the first distance is from about 1.4 to about 1.8.

8. The semiconductor package structure of claim 4, wherein the second portion of the shielding structure extends within a space recessed from an edge of the first device.

9. The semiconductor package structure of claim 8, wherein the first device comprises an antenna, the second device comprises a RF component, and the first shielding units and the second shielding units comprise conductive pillars.

10. The semiconductor package structure of claim 1, wherein the second portion has a channel connected to an opening of the first portion, and the channel extends away from the second device.

11. The semiconductor package structure of claim 1, further comprising an encapsulant covering the first device, the second device, and the shielding structure.

12. The shielding structure of claim 5, wherein the first portion defines a device area configured for disposing an antenna, and the channel of the second portion extends towards the device area.

13. The shielding structure of claim 5, wherein the first portion substantially surrounds all sides of a device area, and the channel of the second portion extends within a space recessed from an edge of the device area.

14. The shielding structure of claim 5, wherein the first portion comprises a plurality of first shielding units, and the opening of the first portion is greater than a pitch of the first shielding units.

15. The shielding structure of claim 5, wherein a ratio of a length of the channel of the second portion to a width of the channel of the second portion is from about 1.6 to about 1.8.

16. The shielding structure of claim 7, wherein the first portion has an opening defined by two ends of the first portion, and the first extending portion and the second extending portion of the second portion are connected to the two ends of the first portion, respectively.

17. The shielding structure of claim 7, wherein an inclusive angle between the first portion and the second portion is from about 85° to about 95°.

* * * * *